US009713292B2

United States Patent
Shinohara et al.

(10) Patent No.: US 9,713,292 B2
(45) Date of Patent: Jul. 18, 2017

(54) DC-DC CONVERTER AND POWER CONVERSION APPARATUS

(71) Applicant: Hitachi Automotive Systems, Ltd., Hitachinaka-shi, Ibaraki (JP)

(72) Inventors: Hidenori Shinohara, Hitachinaka (JP); Mitsuru Yasunami, Yokohama (JP); Tadahiko Chida, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 705 days.

(21) Appl. No.: 14/354,039

(22) PCT Filed: Oct. 17, 2012

(86) PCT No.: PCT/JP2012/076752
§ 371 (c)(1),
(2) Date: Apr. 24, 2014

(87) PCT Pub. No.: WO2013/061832
PCT Pub. Date: May 2, 2013

(65) Prior Publication Data
US 2014/0313806 A1 Oct. 23, 2014

(30) Foreign Application Priority Data
Oct. 27, 2011 (JP) .................................. 2011-235999

(51) Int. Cl.
*H05K 7/20* (2006.01)
*H01H 9/52* (2006.01)
(Continued)

(52) U.S. Cl.
CPC .......... *H05K 7/20927* (2013.01); *H02M 3/28* (2013.01); *H02M 3/335* (2013.01); *H01H 9/52* (2013.01); *H01L 23/473* (2013.01)

(58) Field of Classification Search
CPC .......... H05K 7/20872; H05K 7/20927; H05K 7/20218–7/20272; H05K 7/1432; H01L 23/473
(Continued)

(56) References Cited

U.S. PATENT DOCUMENTS 7,864,529 B2 * 1/2011 Bojan ................ H05K 7/20872
165/80.4
7,969,735 B2 * 6/2011 Nakatsu ................ H02M 7/003
165/104.33
(Continued)

FOREIGN PATENT DOCUMENTS

JP 2006-261368 A 9/2006
JP 2007-306671 A 11/2007
(Continued)

OTHER PUBLICATIONS

International Search Report dated Jan. 15, 2013 with English translation (five (5) pages).

*Primary Examiner* — Zachary M Pape
(74) *Attorney, Agent, or Firm* — Crowell & Moring LLP

(57) ABSTRACT

In a DC-DC converter, the cooling of switching elements has been performed only by means of a cooling plate; therefore, there is a problem in that, to effectively radiate heats generated by power MOSFETs that have large heating values and that are arranged parallel, it becomes necessary to reduce thermal resistances and complicate the cooling route of a water-cooling device. Plural switching elements for controlling currents flowing through inductor elements, which are used for voltage conversion of a DC-DC converter, are fixed to a metal case via a heat conductive insulating material and via a metal radiator having a better heat conduction characteristic than the metal case. Because there occur no large mixing phenomena of heat currents among neighboring switching elements, and there are only little heat interferences between the neighboring switching elements, the thermal diffusion characteristic is improved, and the cooling efficiency for the switching elements can be increased.

4 Claims, 14 Drawing Sheets

(51) Int. Cl.
*H02M 3/335* (2006.01)
*H02M 3/28* (2006.01)
*H01L 23/473* (2006.01)

(58) Field of Classification Search
USPC .......... 361/699–703; 165/80.4–80.5, 104.33; 174/547, 15.1; 257/714; 363/141
See application file for complete search history.

(56) References Cited

U.S. PATENT DOCUMENTS

| | | | |
|---|---|---|---|
| 8,130,499 B2* | 3/2012 | Ohnishi | H01L 23/053 |
| | | | 174/16.3 |
| 9,247,675 B2* | 1/2016 | Higuchi | B60L 11/1803 |
| 9,425,695 B2* | 8/2016 | Shinohara | H05K 9/0037 |
| 2006/0207780 A1 | 9/2006 | Shinmura et al. | |
| 2013/0094269 A1 | 4/2013 | Maeda et al. | |
| 2014/0285970 A1* | 9/2014 | Shinohara | H02M 7/003 |
| | | | 361/689 |
| 2014/0313806 A1* | 10/2014 | Shinohara | H05K 7/20927 |
| | | | 363/141 |

FOREIGN PATENT DOCUMENTS

| | | |
|---|---|---|
| JP | 4300717 B2 | 5/2009 |
| JP | 2010-93202 A | 4/2010 |
| JP | 2011-29480 A | 2/2011 |
| JP | 2013-31250 A | 2/2013 |
| JP | 2013-99053 A | 5/2013 |
| WO | WO 2011/125781 A1 | 10/2011 |

* cited by examiner

DC-DC CONVERTER AND POWER CONVERSION APPARATUS

TECHNICAL FIELD

The present invention relates to power conversion apparatuses for driving loads such as an electric motor, and in particular, relates to a power conversion apparatus that has improved cooling capability for cooling heat-generating components such as power converter elements included in a circuit system of a power conversion apparatus.

BACKGROUND ART

An electric vehicle or a plug-in hybrid vehicle is equipped with an inverter for driving a motor coupled to wheels with the use of a high voltage battery, and a low voltage battery for activating accessories such as vehicle lights, and a radio.

On such a vehicle as above, a DC-DC converter that performs power conversion from a high voltage battery to a low voltage battery or from a low voltage battery to a high voltage battery is mounted.

It is desirable that such a vehicle as above should have the ratio of the space of the vehicle room to the entire volume of the vehicle as large as possible in order to secure riding comfort. It is required for the inverter and the DC-DC converter to be installed in small spaces other than the vehicle room such as an engine room.

Because the temperature environment of the engine room of this kind of vehicle is poorer than the use environment of a related vehicle, it is necessary for the inverter and DC-DC converter of this kind of vehicle to be cooled by a cooling device including a refrigerant formed of water and a mixture. Therefore, a cooling method and a cooling mechanism having high cooling efficiency and as small a footprint as possible become important technology components. One of these technology components is well known in which heats generated by switching elements of a DC-DC converter, a transformer, choke coils, bus bars, and the like are conducted to a cooling plate via solid conduction and radiated by the cooling plate.

CITATION LIST

Patent Literature

Patent Literature 1: Japanese Patent No. 4300717

SUMMARY OF INVENTION

Technical Problem

The above Patent Literature 1 discloses a method in which the surface of a resin plate, which is molded from resin, is firmly attached to the surfaces of heat-generating components, and heats generated by the heat-generating components are radiated by a cooling plate that is cooled by a water-cooling device, with the result that effective cooling to cool the heat-generating components in the case is achieved.

In this related art, however, the cooling of switching elements is performed only by means of a cooling plate, therefore there is a problem in that, in order to effectively radiate heats generated by power MOSFETs that have large heating values and that are arranged parallel, it becomes necessary to reduce thermal resistances and complicate the cooling route of a water-cooling device.

An object of the present invention is to provide a power conversion apparatus including a cooling structure capable of effectively cooling switching elements that are heat-generating components used in a DC-DC converter.

Solution to Problem

The feature of the present invention lies in the fact that, in a power conversion apparatus equipped with a metal case on which at least inductor elements used for converting a voltage and plural switching elements for controlling currents flowing through the inductor elements are mounted, the switching elements are fixed to the metal case via a heat conductive insulating material and via a metal radiator having a better heat conduction characteristic than the metal case.

Advantageous Effects of Invention

According to the present invention, because the heat dissipation ability of the radiator is good, and there occur no large mixing phenomena of heat currents among neighboring switching elements, there are only little interferences among the neighboring switching elements. Therefore, because the thermal diffusion characteristic is improved, the cooling efficiency for the switching elements disposed outside the cooling range of a cooling channel can be increased.

DESCRIPTION OF EMBODIMENTS

Although the description of the embodiments of the present invention will be made hereinafter with reference to the accompanying drawings, the description will be made about two chapters: an explanation about the configuration of a power conversion apparatus as an example of power conversion apparatuses to which the present invention is applied is made in one chapter, and an explanation about a practical example of the present invention is made in the other chapter.

First, the mechanical configuration and circuit configuration of a power conversion apparatus to which the present invention is applied will be explained.

(Explanation about Mechanical and Circuit Configurations of Power Conversion Apparatus)

Figure 1:
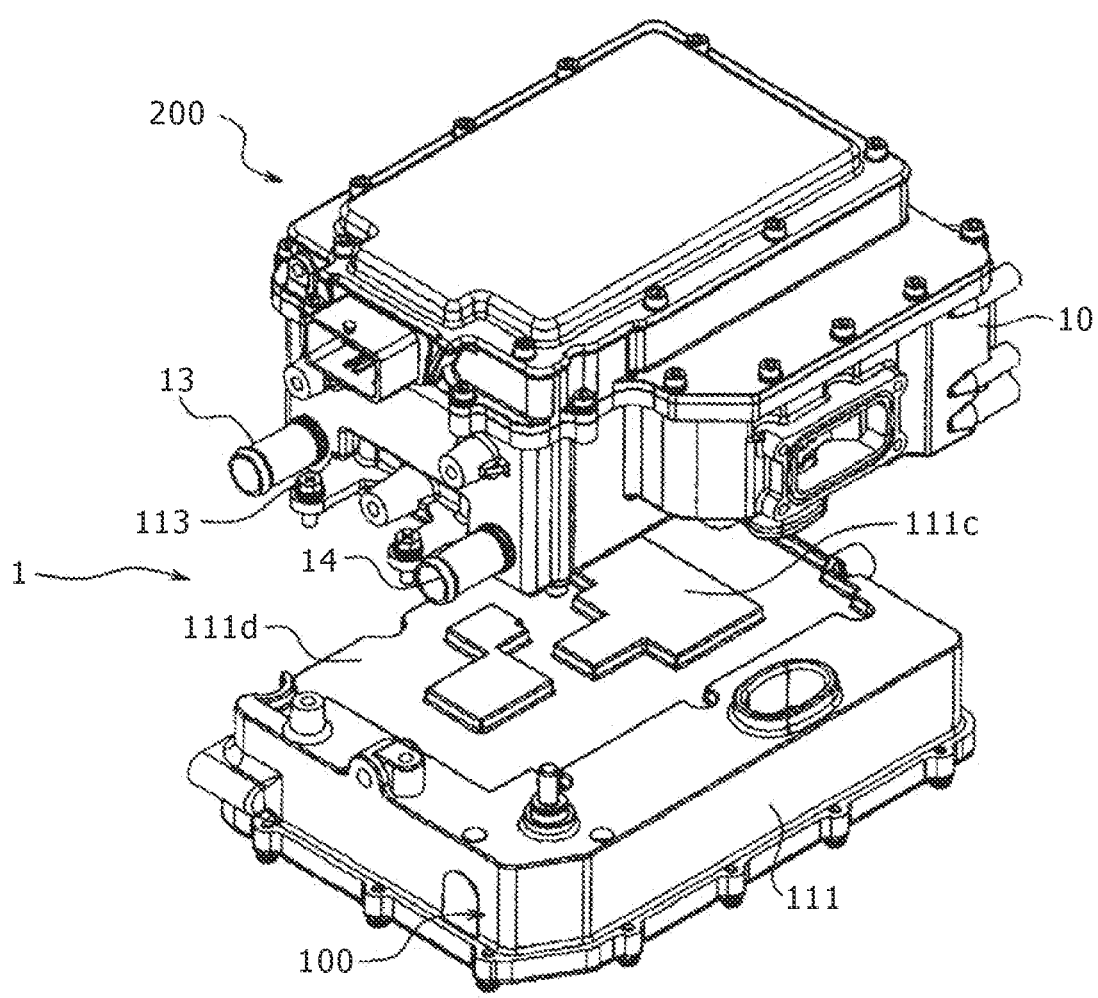
FIG. 1 is the external perspective view of a power conversion apparatus to which the present invention is applied.
Figure 2:
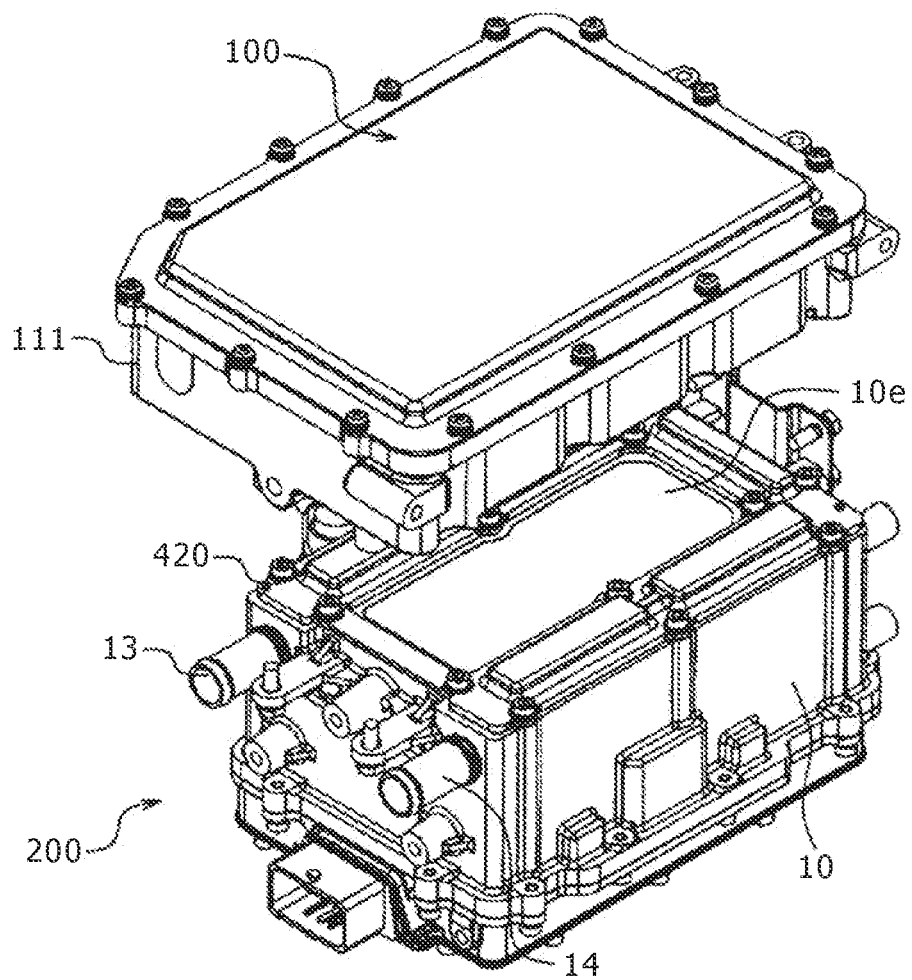
FIG. 2 is the external perspective view of the power conversion apparatus, to which the present invention is applied, that is viewed from the opposite side of the view point of FIG. 1.

FIG. 1 and FIG. 2 are external perspective views of a power conversion apparatus 1, and the power conversion apparatus 1 is an integrated combination of a DC-DC converter 100 and an inverter 200. FIG. 1 and FIG. 2 respectively show the external perspective views in which the DC-DC converter 100 and the inverter 200 are respectively separated from each other. The DC-DC converter 100 is fixed to the bottom surface side of the case of the inverter 200 with plural bolts 113.

This power conversion apparatus 1 is applied to an electric vehicle and the like, and the inverter 200 drives a driving motor with the use of electric power supplied from an in-vehicle high voltage battery. A low voltage battery for activating accessories such as lights and a radio are mounted on the vehicle, and the DC-DC converter 100 performs power conversion from the high voltage battery to the low voltage battery or from the low voltage battery to the high voltage battery.

As described later, a refrigerant channel through which a refrigerant flows is formed inside the side wall of the case 10 of the inverter 200. The refrigerant flows into the channel from an entrance pipe 13, and flows out from an exit pipe 14. A lower cover 420 is fixed to the lower edge of the side wall inside which the channel is installed in order to stop up the opening of the channel. In other words, the refrigerant channel is formed under the lower cover 420 shown in FIG. 2. Therefore, a part of the lower cover 420 is protruding in a U-shaped state on the bottom surface side of the case 10, and the central part of the bottom surface forms a concave portion 10e.

On the other hand, a concave portion 111d and a convex portion 111c are formed on the surface of the case 111 of the DC-DC converter 100, wherein the surface is facing the inverter 200. The inverter 200 is fixed to the DC-DC converter 100 in such a way that a portion of the bottom surface of the case 10 is engaged with this concave portion 111d.

Figure 3:
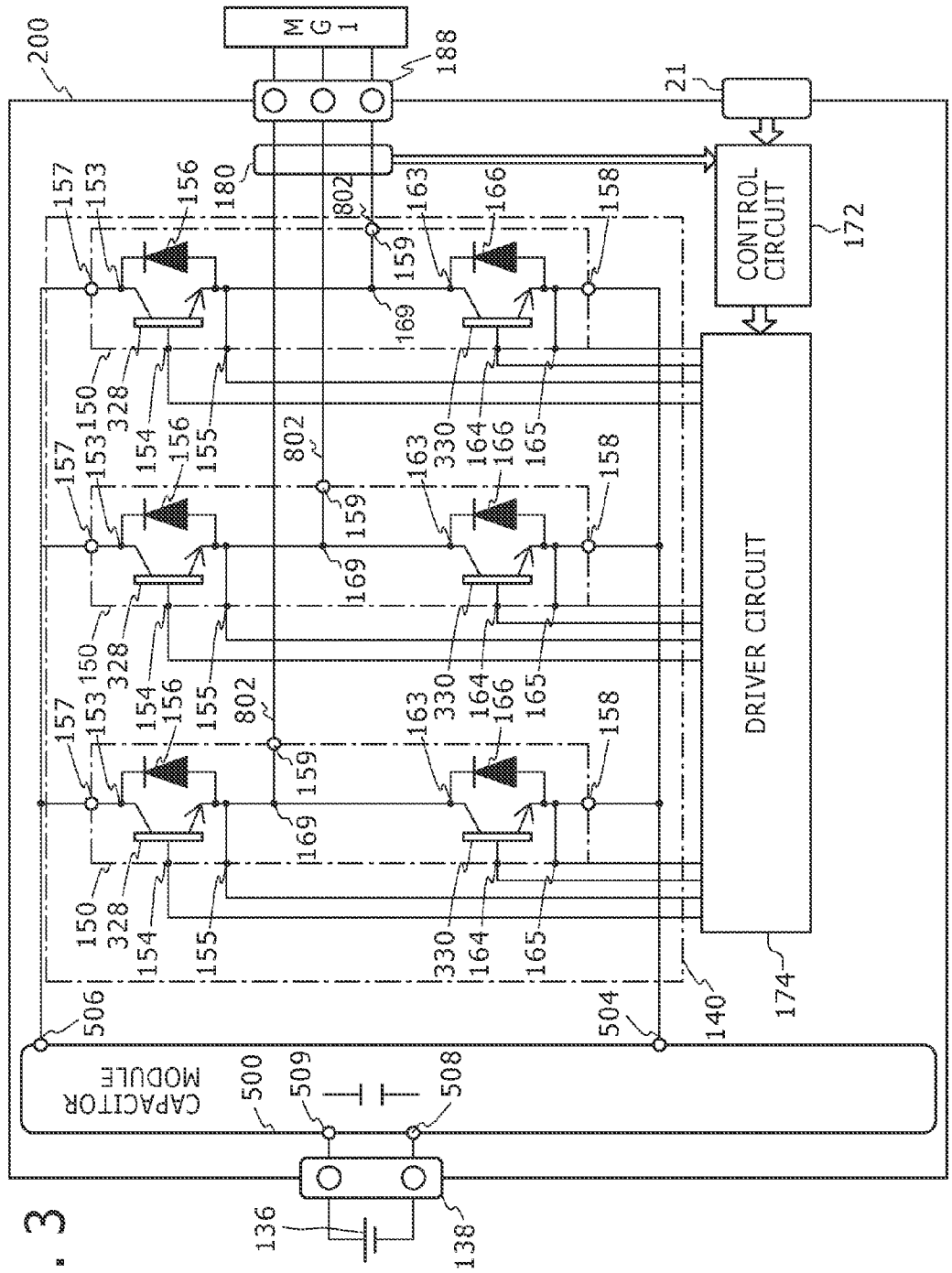
FIG. 3 is a circuit diagram for explaining the circuit configuration of an inverter.

FIG. 3 is a circuit diagram for explaining the circuit configuration of the inverter 200, and insulated gate bipolar transistors are used as semiconductor elements in FIG. 3. An insulated gate bipolar transistor will be abbreviated to an IGBT hereinafter. An IGBT 328 and a diode 156 operate as an upper arm and an IGBT 330 and a diode 166 operate as a lower arm, and a series circuit 150 includes the upper arm and the lower arm. An inverter circuit 140 includes three series circuits 150 corresponding to three phases, that is, the U-phase, V-phase, and W-phase of AC power to be output.

These three phases respectively correspond to three-phase coils of the armature coils of a motor generator MG1 that corresponds to the driving motor in this embodiment. A series circuit 150 including the upper and lower arms for each of the three phases outputs an AC current from an intermediate electrode 169 that is the middle portion of the series circuit. This intermediate electrode 169 is coupled to an AC bus bar 802, which is an AC power line to the motor generator MG1, via AC terminals 159 and 188.

The collector electrode 153 of the IGBT 328 of the upper arm is electrically coupled to a capacitor terminal 506 on the positive pole side of a capacitor module 500 via a positive pole terminal 157. In addition, the emitter electrode of the IGBT 330 of the lower arm is electrically coupled to a capacitor terminal 504 on the negative pole side of the capacitor module 500 via a negative pole terminal 158.

As described above, a control circuit 172 receives a control command from an upper control device via a connector 21, and generates a control pulse that is a control signal for controlling an IGBT 328 of an upper arm and an IGBT 330 of a lower arm of a series circuit 150 corresponding to each phase that is included in the inverter 140 on the basis of this command. Subsequently, the control circuit 172 sends the generated control pulse to a driver circuit 174.

The driver circuit 174 supplies a driving pulse for controlling the IGBT 328 of the upper arm and the IGBT 330 of the lower arm of the series circuit 150 corresponding to each phase to the IGBT 328 and the IGBT 330 corresponding to the phase. The IGBTs 328 and the IGBTs 330 perform ON/OFF operation on the basis of the driving pulse sent from the driver circuit 174. In this way DC power supplied from a battery 136 is converted into three-phase AC power. This converted AC power is supplied to the motor generator MG1.

The IGBT 328 includes a collector electrode 153, a signal-receiving emitter electrode 155, and a gate electrode 154. The IGBT 330 includes a collector electrode 163, a signal-receiving emitter electrode 165, and a gate electrode 164. The diode 156 is electrically coupled between the collector electrode 153 and the emitter electrode 155. In addition, the diode 166 is electrically coupled between the collector electrode 163 and the emitter electrode 165.

A metal-oxide semiconductor field-effect transistor (abbreviated to a MOSFET hereinafter) can be used as a switching power semiconductor element. In this case, the diodes 156 and 166 become unnecessary. As a switching power semiconductor element, an IGBT is suitable for the case of a DC voltage being comparatively high, and a MOSFET is suitable for the case of the DC voltage being comparatively low.

The capacitor module 500 includes the capacitor terminal 506 on the positive pole side, the capacitor terminal 504 on the negative pole side, a power supply terminal 509 on the positive pole side, and a power supply terminal 508 on the negative pole side. High voltage DC power supplied from the battery 136 is supplied to the power supply terminal 509 on the positive pole side and the power supply terminal 508 on the negative pole side via a DC connector 138. The high voltage DC power is supplied to the inverter circuit 140 via the capacitor terminal 506 on the positive pole side and the capacitor terminal 504 on the negative pole side of the capacitor module 500.

On the other hand, the DC power obtained by converting the AC power by the inverter circuit 140 is supplied to the capacitor module 500 via the capacitor terminal 506 on the positive pole side and the capacitor terminal 504 on the negative pole side. The DC power is supplied to the battery 136 from the power supply terminal 509 on the positive pole side and the power supply terminal 508 on the negative pole side, and stored in the battery 136.

The control circuit 172 includes a microcomputer (abbreviated to an MPU hereinafter) that executes arithmetic processing to determine switching timings of the IGBTs 328 and IGBTs 330. Information input into the MPU includes a target torque value that is required from the motor generator MG1, a current value that is supplied to the motor generator MG1 from the series circuits 150, and the magnetic pole positions of rotators of the motor generator MG1.

The target torque value is determined on the basis of a command signal output from the upper control device (not shown). The current value is detected on the basis of a detection signal detected by a current sensor 180. The magnetic pole positions are detected on the basis of a detected signal output from a rotating magnetic pole sensor (not shown) such as a resolver installed in the motor generator MG1. Although the current sensor 180 is assumed to be a current sensor that detects the values of three phase-currents in this embodiment, it is conceivable that the values of two phase-currents of three phase-currents are detected and the value of the remaining phase-current is obtained by calculation.

The MPU embedded in the control circuit 172 calculates the d-axis current command value and the q-axis current command value of the motor generator MG1 on the basis of the target torque value, and a d-axis voltage command value and a q-axis voltage command value are calculated on the basis of a difference between the calculated d-axis current command value and a detected d-axis current command value and a difference between the calculated q-axis current command value and a detected q-axis current command value. Subsequently, these calculated d-axis and q-axis voltage command values are converted into voltage command values for the U-phase, V-phase, and W-phase on the basis of the detected magnetic pole positions.

Subsequently, the MPU generates a pulse-shaped modulation wave on the basis of comparison between a fundamental wave (sinusoidal wave) and a carrier wave (triangular wave), wherein the fundamental wave and the carrier wave are calculated on the basis of the voltage command values for the U-phase, V-phase, and W-phase. Subsequently, the MPU outputs this generated modulation wave to the driver circuit 174 as a PWM (pulse-width modulation) signal.

When the driver circuit 174 drives a lower arm, the driver circuit 174 outputs a drive signal, which is obtained by amplifying the PWM signal, to the gate electrode of the IGBT 330 of the lower arm. In addition, when the driver circuit 174 drives an upper arm, the driver circuit 174 shifts the reference potential of the PWM signal to the level of the reference potential of the upper arm and amplifies this PWM signal, and then outputs the amplified PWM signal to the IGBT 328 of the upper arm 328 as a drive signal.

The MPU embedded in the control circuit 172 performs abnormality detection (detection of excess current, excess voltage, excess temperature, and the like) to protect the series circuit 150. Therefore, sensing information is input into the control circuit 172.

For example, from the signal-receiving emitter electrode 155 of an IGBT 328 of an upper arm, information about a current flowing through the emitter electrode is input into the corresponding driving unit (IC) and from the signal-receiving emitter electrode 165 of an IGBT 330 of a lower arm, information about a current flowing through the emitter electrode is input into the corresponding driving unit (IC). On the basis of above information, each driving unit (IC) performs excess current detection, and if an excess current is detected, the switching operation of the corresponding IGBT 328 or IGBT 330 is stopped to protect the corresponding IGBT 328 or IGBT 330 from the excess current.

Information about the temperature of the series circuit 150 is input into the MPU by a temperature sensor (not shown) that is installed in the series circuit 150. In addition, information about the voltage on the DC positive pole sides of the series circuits 150 is input into the MPU. The MPU performs excess temperature detection and excess voltage detection on the basis of these pieces of information, and if an excess temperature or an excess voltage is detected, the MPU stops the switching operations of all the IGBTs 328 and all the IGBTs 330.

Figure 4:
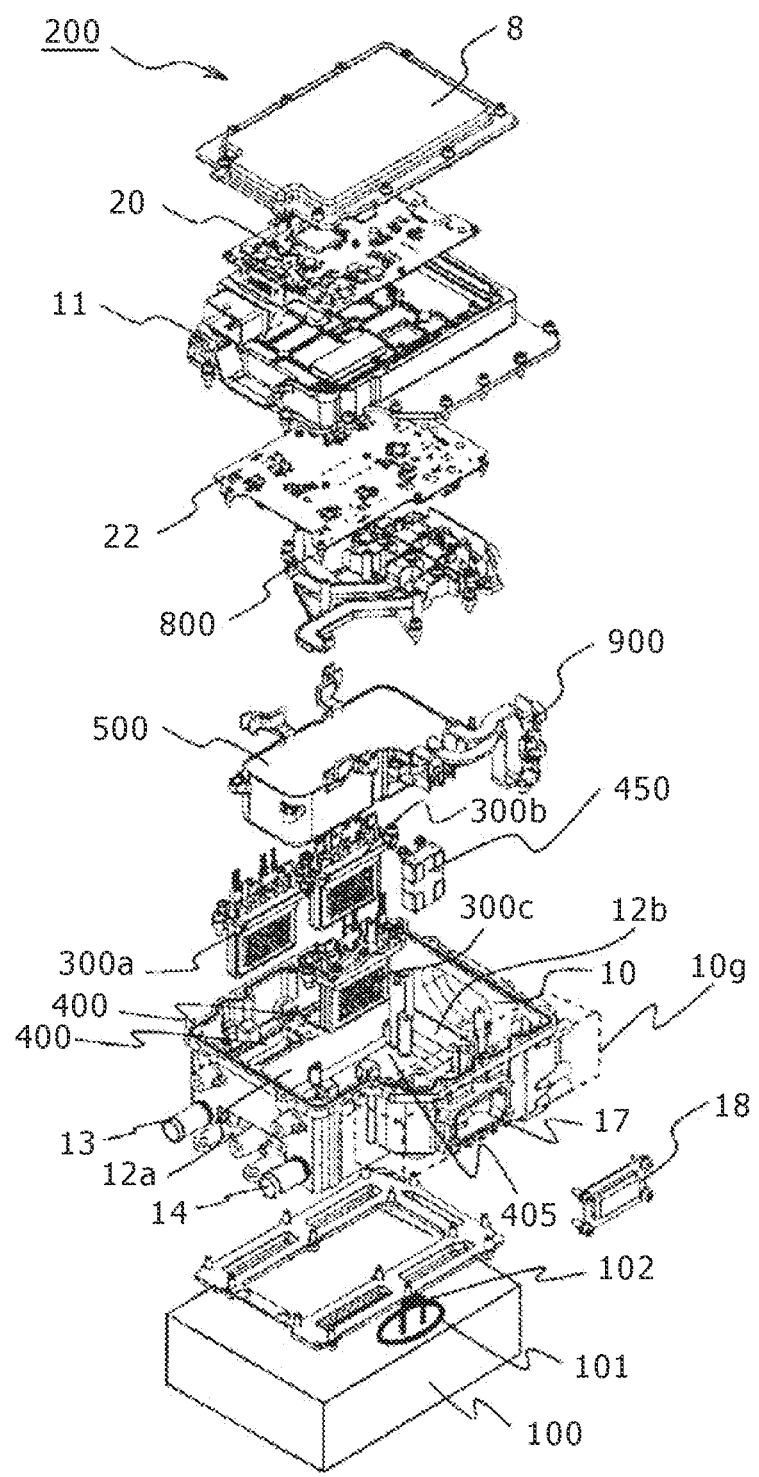
FIG. 4 is an exploded perspective view of the inverter.

FIG. 4 is an exploded perspective view of the inverter 200. The entrance pipe 13 into which the refrigerant flows and the exit pipe 14 from which the refrigerant flows out are disposed on the same side wall of the case 10. Channel forming sections 12a, 12b, and 12c are installed in a U-shaped state on the bottom surface side of the case 10. Here, the channel forming section 12c is disposed parallel with and opposite to the channel forming section 12a, and is in hiding in FIG. 4.

Figure 7:
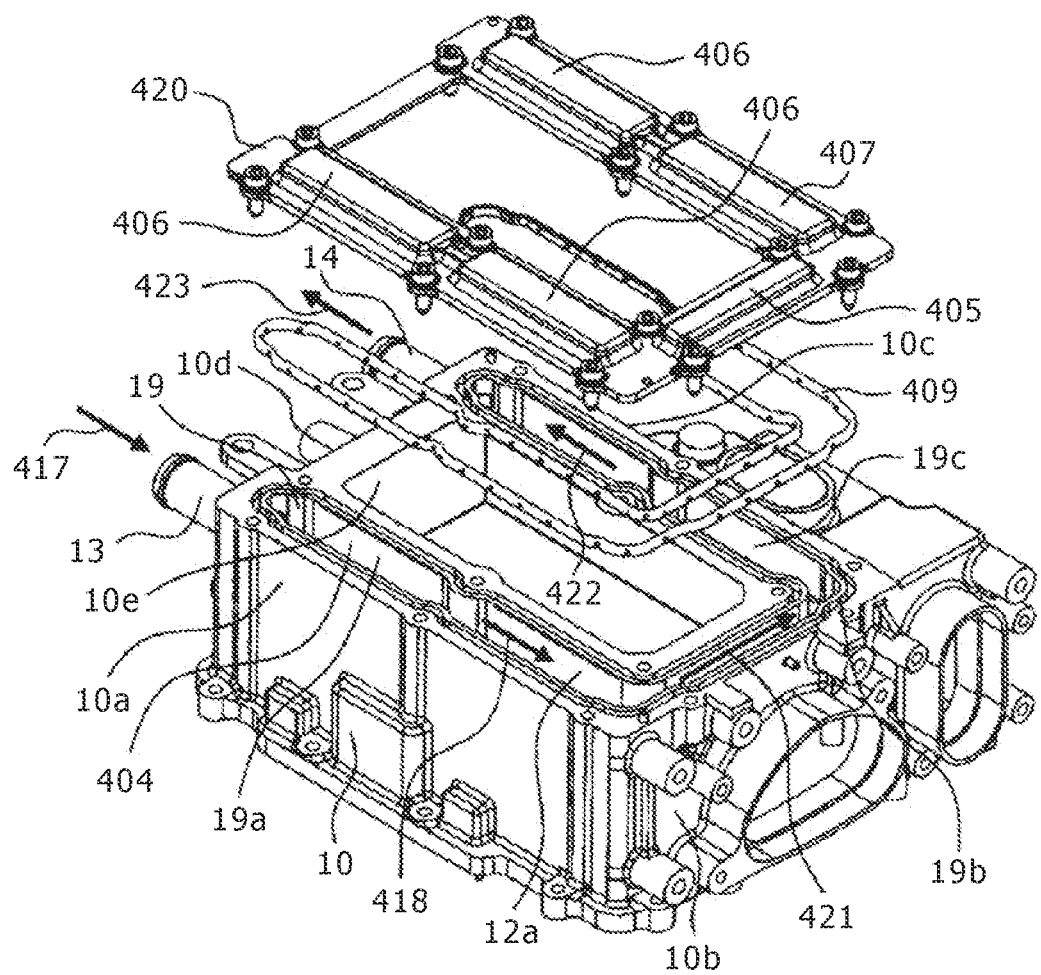
FIG. 7 is the exploded perspective view of the inverter viewed from the bottom surface side of the inverter.

An after-mentioned refrigerant channel 19 is formed in the channel forming sections 12a, 12b, and 12c (Refer to FIG. 7). A refrigerant that flows into the entrance pipe 13 flows through the refrigerant channel 19 in the channel forming sections 12a, 12b, and 12c, and flows out from the exit pipe 14.

Plural openings 400 are formed on the channel forming sections 12a and 12c, which are disposed parallel with each other, in order to install power semiconductor modules 300a to 300c in the refrigerant channel. In an example shown in FIG. 4, two openings 400, in which the power semiconductor modules 300a and 300b are installed, are formed on the channel forming section 12a installed on the left side of FIG. 4.

On the other hand, one opening 400, in which the power semiconductor modules 300c is installed, is formed on the channel forming section 12c that is installed opposite to and parallel with the forming section 12a although it is in hiding in FIG. 4. The above openings 400 are stopped up by the power modules 300a to 300c respectively fixed to the channel forming sections 12a and 12c.

Figure 5:
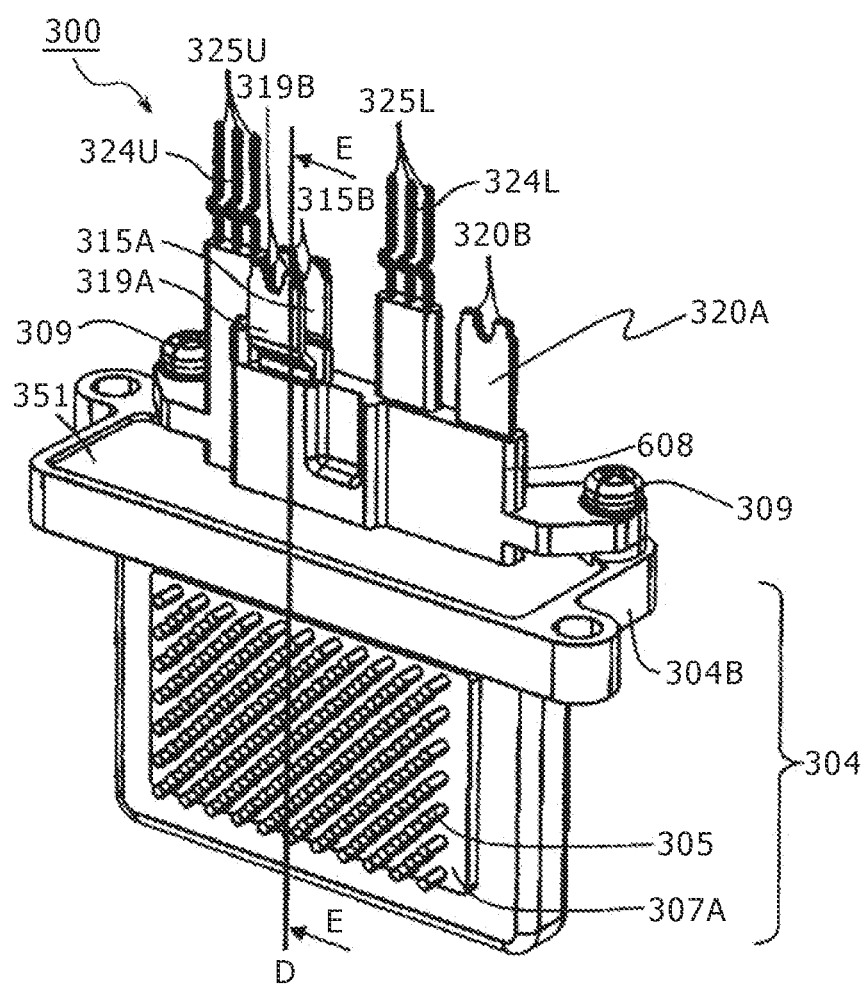
FIG. 5 is the external perspective view of a power semiconductor module.
Figure 6:
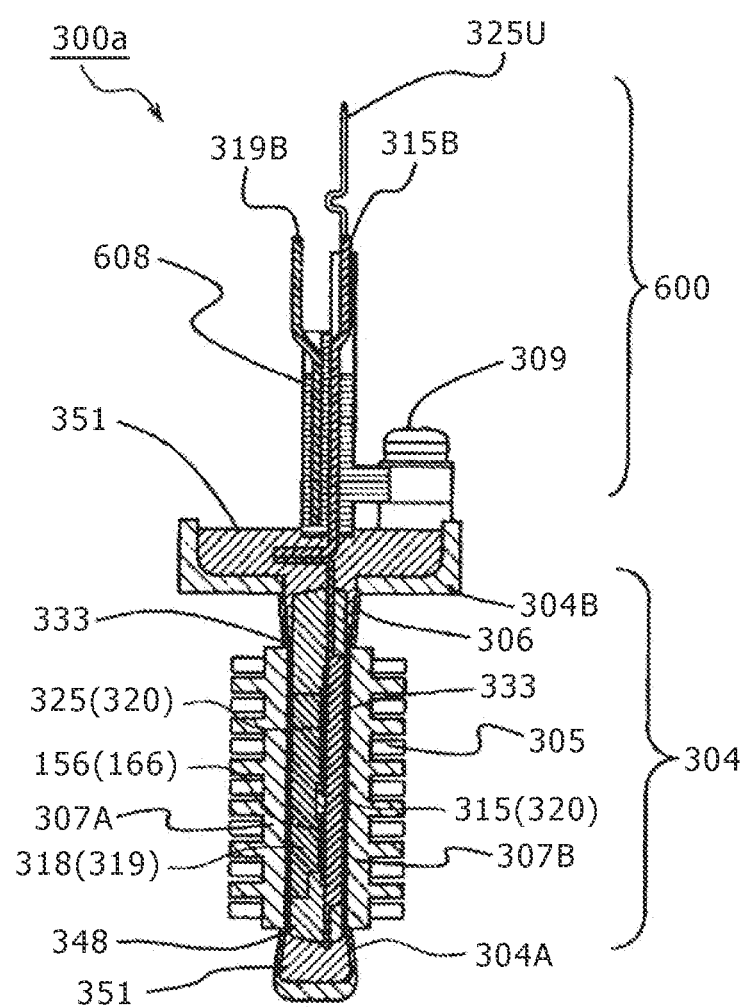
FIG. 6 is the cross-section view of the power semiconductor module.

FIG. 5 and FIG. 6 are diagrams for explaining the power semiconductor module 300a, and because the power semiconductor modules 300a to 300c have the same configurations, the configuration of the power semiconductor module 300a will be described as a representative of the three configurations. FIG. 5 is an external perspective view of the power semiconductor module 300a, and FIG. 6 is the cross-section view of the power semiconductor module 300a cut along the line D and viewed in a direction shown by arrows E.

Signal terminals 325U shown in FIG. 5 and FIG. 6 correspond to the gate electrodes 154 and the signal-receiving emitter electrodes 155 shown in FIG. 3, and signal terminals 325L shown in FIG. 5 correspond to the gate electrodes 164 and the emitter electrodes 165 shown in FIG. 3. In addition, DC positive pole terminals 315B are the same as the positive pole terminals 157 shown in FIG. 3, and DC negative pole terminals 319B are the same as the negative pole terminals 158 shown in FIG. 3. Further, AC terminals 320B are the same as AC terminals 159 shown in FIG. 3.

The cross-section view shown in FIG. 6 shows a portion in which the IGBT 328 and the diode 156 of the series circuit 150 of the upper and lower arms are disposed. The IGBT 330 and the diode 166 are disposed respectively behind the IGBT 328 and the diode 156 in a direction perpendicular to the plane of the page. The IGBT 328 and the diode 156 are fixed in such a way that they are sandwiched between a conductor plate 315 and a conductor plate 318.

Similarly, the IGBT 330 and the diode 166 are fixed in such a way that they are sandwiched between a conductor plate 319 and a conductor plate 320. The conductor plate 315 and the like are sealed by first sealing resin 348 with its cooling surfaces exposed, and insulating sheets 333 are bonded to the cooling surfaces by thermocompression bonding.

A modular primary sealed unit sealed by the first sealing resin 348 is inserted into a modular case 304, and is bonded to the inner surface of the modular case 304, which is a CAN-type cooling vessel, by thermocompression bonding with the insulating sheets 333 therebetween. Here, the can-type cooling vessel is a cylindrical cooler having a loading opening 306 on one of its surfaces and a bottom on the other. Spaces remaining inside the modular case 304 are filled with second sealing resin 351.

The modular case 304 contains a conductive member such as an aluminum alloy (Al, AlSi, AlSiC, AlC, or the like), and is seamlessly and integrally molded. The modular case 304 is configured to have no openings except for the loading opening 306, and the outer periphery of the loading opening 306 is surrounded by a flange 304B.

A first cooling surface 307A and a second cooling surface 307B, both of which are larger than other surfaces, are disposed in such a way that they face each other, and power semiconductor elements (the IGBT 328, the IGBT 330, the diode 156, and the diode 166) are disposed so as to face the above cooling surfaces.

Three surfaces that couple the first cooling surface 307A and the second cooling surface 307B, which face each other, build up hermetically-sealed surfaces having narrower widths than those of the first cooling surface 307A and the second cooling surface 307B. The loading opening 306 is formed on the remaining one surface. It is not necessary that the shape of the modular case 304 should be an accurate rectangular solid, and it is all right if the surfaces of corners of the modular case 304 are curved surfaces as shown in FIG. 6.

Being a metal case of such a shape, the modular case 304 can secure sealing to block a refrigerant at the flange 304B if the modular case 304 is inserted into the refrigerant channel 19 through which the refrigerant such as water or oil flows, therefore the modular case with a simple configuration as above can prevent the refrigerant from leaking into the inside of the modular case 304.

Fins 305 are evenly mounted on the first cooling surface 307A and the second cooling surface 307B that face each other. Further, curvature components 304A whose thicknesses are extremely thin are formed on the outer peripheries of the first cooling surface 307A and the second cooling surface 307B. Because the thicknesses of the curvature components 304A are so thin that the curvature component 304A can be easily deformed only by applying pressure on any of the fins 305, the productivity after the insertion of the modular primary sealed unit is improved.

A metallic DC positive pole wiring 315A and a metallic DC negative pole wiring 319A, which electrically couple to the capacitor module 500, are installed outside of the modular case 304, and the DC positive pole terminals 315B (157) and the DC negative pole terminals 319B (158) are respectively formed on the tops of the metallic DC positive pole wiring 315A and the metallic DC negative pole wiring 319A.

In addition, a metallic AC wiring 320A for supplying AC power to the motor generator MG1 is installed, and the AC terminals 320B (159) are formed on the top of the metallic AC wiring 320A. In this embodiment, the DC positive pole wiring 315A is coupled to the conductor plate 315, the DC negative pole wiring 319A is coupled to the conductor plate 319, and the AC wiring 320A is coupled to the conductor plate 320.

Metallic signal wirings 324U and 324L that couple to the driver circuit 174 are also installed outside the modular case 304, and the signal terminals 325U (154, 155) and the signal terminals 325L (164, 165) are formed respectively on the tops of the metallic signal wirings 324U and 324L. In this embodiment, the signal wirings 324U are coupled to the IGBT 328, and the signal wirings 324L are coupled to the IGBT 330.

The DC positive pole wiring 315A, the DC negative pole wiring 319A, the AC wiring 320A, the signal wirings 324U, and the signal wirings 324L are insulated from each other by wiring insulating members 608 molded from resin material, and integrally molded as an auxiliary molded unit 600. The wiring insulating members 608 also work as supporting members to support each wiring, and heat-hardening resin with insulation performance or thermoplastic resin with insulation performance is suitable for the resin material of the wiring insulating members 608. With the use of the above wiring insulating members 608, insulation among the DC positive pole wiring 315A, the DC negative pole wiring 319A, the AC wiring 320A, the signal wirings 324U, and the signal wirings 324L can be secured, therefore high-density wiring can be achieved.

After being metallically joined to the modular primary sealed unit, the auxiliary molded unit 600 is fixed to the modular case 304 by screws 309 that pass through threaded screw holes installed in the wiring insulating members 608. The metal junction between the modular primary sealed unit and the auxiliary molded unit 600 at a junction unit 370 can be achieved with the use of TIG welding, for example.

The DC positive pole wiring 315A and the DC negative pole wiring 319A are laminated with the wiring insulating member 608 therebetween while facing each other, and the DC positive pole wiring 315A and the DC negative pole wiring 319A extend almost parallel with each other. With such a disposition and a configuration as above, currents, which instantaneously flow when the power semiconductor elements perform switching operations, flow facing each other and in directions that are opposite to each other. Therefore, magnetic fields induced by the currents cancel each other, so that the values of inductors can be reduced owing to this cancellation. Here, the AC wiring 320A, the signal terminals 325U, and the signal terminals 325L also extend in the same direction as the DC positive pole wiring 315A and the DC negative pole wiring 319A.

The junction unit 370 at which the modular primary sealed unit and the auxiliary molded unit 600 are metallically joined is encapsulated in the modular case 304 along with the second sealing resin 351. Because necessary insulation distances between the junction unit 370 and the modular case 304 can be stably secured, the power semiconductor module 300a can be downsized more easily in comparison with the case where spaces within the modular case are not filled with the second sealing resin.

Returning to FIG. 4, an area surrounded by the channel forming sections 12a to 12c, which are installed in a U-shaped state, form a housing space 405 for housing the capacitor module 500. The capacitor module 500 housed in the housing space 405 is cooled by the refrigerant flowing through the refrigerant channel in the channel forming sections 12a to 12c. In this way, the capacitor module 500 is disposed so as to be surrounded by the channel forming units 12a to 12c in which the refrigerant channel is installed, therefore the capacitor module 500 is effectively cooled.

In addition, because the channel is formed along the outer side surface of the capacitor module 500, the channel, the capacitor module 500, and the power semiconductor modules 300a to 300c can be disposed in an orderly manner, so that the entire size can be reduced. Further, because the refrigerant channel is disposed along the long side of the capacitor module 500, and distances between the refrigerant channel and the power semiconductor modules 300a to 300c, which are inserted and fixed in the refrigerant channel, are kept almost constant, the circuit constants of a smoothing capacitor and a power semiconductor module circuit can be easily balanced at each phase of the three phases, so that the circuit configuration that easily reduce the magnitudes of spike voltages can be realized. In this embodiment, water is most suitable as a refrigerant, but other cooling media can also be used.

A bus bar assembly 800 is disposed over the capacitor module 500. The bus bar assembly 800 includes an AC bus bar, and a support member that supports the AC bus bar. In addition, the bus bar assembly 800 includes the current sensor 180. By integrally molding the channel forming sections 12a to 12c and the case 10 with the use of aluminum casting, an effect that not only the cooling efficiency but also the mechanical strength of the case 10 are enhanced is brought about. Further, the thermal conduction of the entirety of the inverter 200 is improved, and the cooling efficiency is increased. It goes without saying that it is all right if the channel forming sections 12a to 12c and the case 10 are formed separately.

A driver circuit board 22 is disposed over the bus bar assembly 800. In addition, a metal baseboard 11 is disposed between the driver circuit board 22 and a control circuit board 20. The metal baseboard 11 is fixed to the case 10. The metal baseboard 11 has a function of electromagnetically shielding a circuit group mounted on the driver circuit board 22 and the control circuit board 20, and also has a working of diffusing heat generated by the driver circuit board 22 and the control circuit board 20 for cooling.

In addition, the metal baseboard 11 has a working of heightening the mechanical resonance frequency of the control circuit board 20. In other words, thread connection parts for fixing the control circuit board 20 to the metal baseboard 11 can be disposed at short intervals, so that, when a mechanical vibration occurs, a distance between the supporting points can be set short, and the resonance frequency of the vibration can be set high. Because the resonance frequency of the control circuit board 20 can be set higher than the vibration frequency transmitted from an engine or the like, the control circuit board 20 is not so much influenced by the vibration, which improves the reliability. A lid 8 is fixed to the metal baseboard 11, and the lid 8 prevents the control circuit board 20 from being affected by external electromagnetic noises.

The case 10 according to this embodiment includes an approximate rectangular solid-shaped housing portion that houses the channel forming section 12, and a protruding housing portion 10g is formed on one side surface of the case 10. The protruding housing portion 10g houses a terminal 102, a bus bar assembly 900 on the DC side, and a resistor 450 that are extended from the DC-DC converter 100. Here, the resistor 450 is a resistor element used for discharging electric charge stored in the capacitor element of the capacitor module 500. As described above, the electric circuit parts between the battery 136 and the capacitor module 500 are collectively housed in the protruding housing portion 10g, which prevents the wirings from becoming complicated, and contributes the downsizing of the entirety of the apparatus.

A lid 18 is a member for covering a window 17 that is used for coupling the terminal 102 extended from the DC-DC converter 100. Here, an opening 101, through which the terminal 102 passes, is formed on the surface of the DC-DC converter 100 that faces the bottom surface of the case 10.

As described above, this assembly is configured to be performed in such a way that the channel forming section 12 is disposed on the bottom surface side of the inverter 200, and necessary components such as the capacitor module 500, the bus bar assembly 800, and the boards are fixed sequentially from top down, which improves the productivity and reliability.

FIG. 7 is a diagram of the case 10 viewed from the bottom surface side to which the lower cover 420 is fixed. The case 10 is a rectangular solid including four side walls 10a, 10b, 10c, and 10d. An opening 404 of the refrigerant channel 19 is formed on the bottom surface side of the case 10. The U-shaped refrigerant channel 19 includes three straight channel section (a first channel section 19a, a second channel section 19b, and a third channel section 19c). The opening 404 is also U-shaped, and this opening 404 is covered by the lower cover 420. A sealing member 409 is installed between the lower cover 420 and the case 10 in order to keep airtightness.

Three convex portions 406 and one convex portion 407, which protrude in a direction opposite to the direction of the refrigerant channel 19, are formed on a position facing the first channel section 19a and the second channel section 19b on the lower cover 420. The three convex portions 406 are formed respectively corresponding to the power semiconductor modules 300a to 300c.

Here, the convex portion 407 formed on the position corresponding to the third channel section 19c is installed for adjusting the cross-section area of the refrigerant channel 19, and no power semiconductor module is disposed on this channel section. The shape of the convex portion 407 is the same as that of one of the convex portions 406. A portion designated by the reference sign 10e is the bottom of the housing space 405 for housing the capacitor module 500 (Refer to FIG. 4).

The refrigerant flows into the entrance pipe 13 as shown an arrow 417, and flows in the first channel section 19a, which is formed along the long side of the case 10, in the direction shown by an arrow 418. In addition, the refrigerant flows in the second channel section 19b, which is formed along the short side of the case 10, in the direction shown by an arrow 421. This second channel section 19b forms a loopback channel.

Next, the refrigerant flows in the third channel section 19c of the channel forming section 12 that is formed along the long side of the case 10. The third channel section 19c is formed parallel with the first channel section 19a with the capacitor module 500 therebetween. The refrigerant flows out from the exit pipe 14 as shown by an arrow 423.

Each of the first channel section 19a, the second channel section 19b, and the third channel section 19c is formed in such a way that its depth is larger than its width. In addition, because openings 400 are formed on the channel forming section 12 so that the openings 400 face the opening 404 formed on the back surface of the case 10, these openings are easily formed by aluminum casting.

Figure 8:
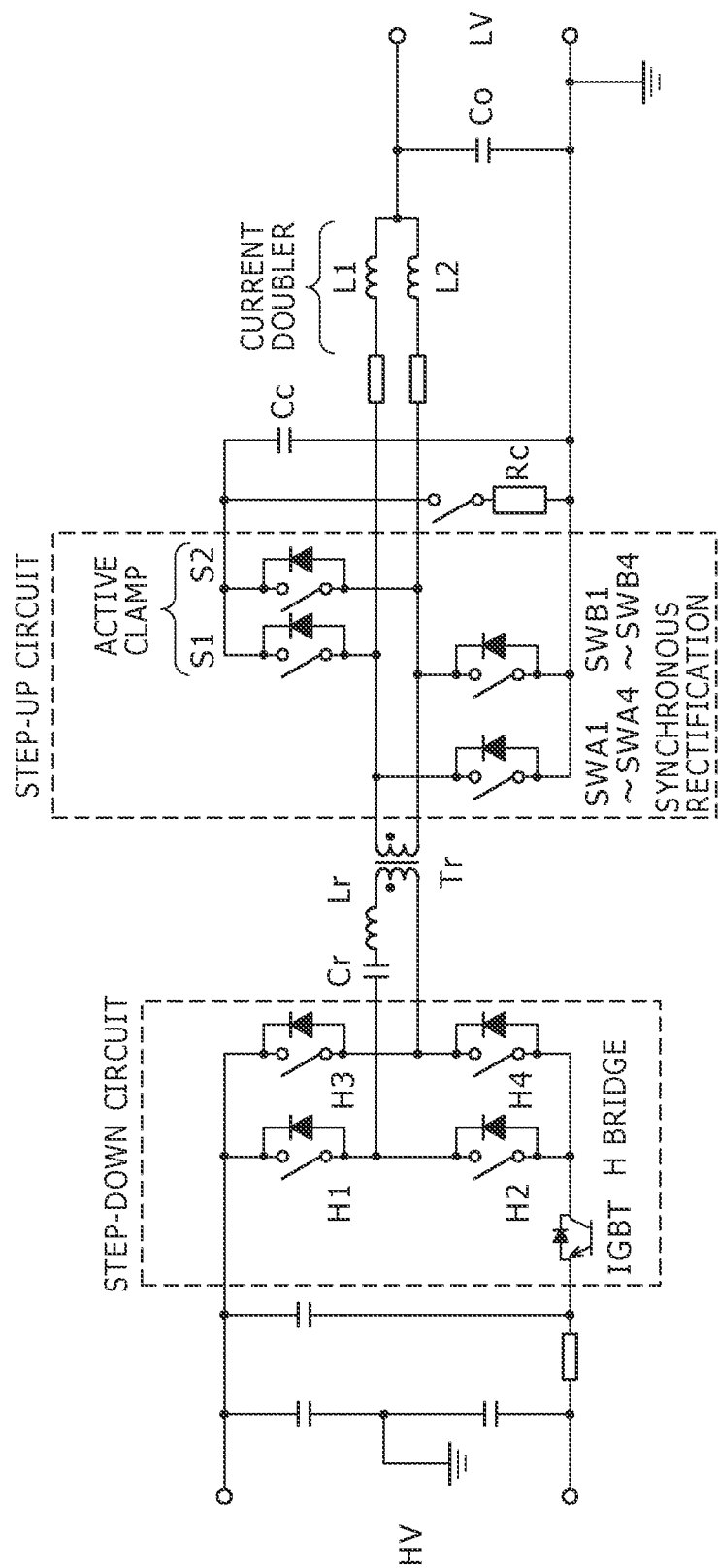
FIG. 8 is a circuit diagram showing the circuit configuration of a DC-DC converter.

Next, the DC-DC converter 100 will be described. FIG. 8 is a diagram showing the circuit configuration of the DC-DC converter 100. As shown in FIG. 8, the DC-DC converter 100 according to this embodiment is compatible with two-way DC-DC conversion.

Therefore, a step-down circuit (HV circuit) and a step-up circuit (LV circuit) are not configured to be diode rectifying circuits, but configured to be synchronous rectifying circuits. In addition, in order to obtain high output powers by HV/LV conversion, introduction of high-current switching elements and large-size smoothing coils have been examined.

To put it concretely, an H bridge-type synchronous rectifying switching circuit configuration (H1 to H4), which uses MOSFETs each of which includes a recovery diode, is adopted on both HV and LV sides. As for switching control, by adopting zero-cross switching with the use of a high switching frequency (100 kHz) generated by an LC series resonance circuit (Cr, Lr), it becomes possible to improve the conversion efficiency and to reduce the thermal loss. Here, a switching element IGBT has a function of switching the behavior of the DC-DC converter 100 so that the DC-DC converter 100 can perform the two-way DC-DC conversion.

In addition, by installing an active clamp circuit, it becomes possible to reduce losses owing to cyclic currents generated by the step-down operation and to suppress the generation of surge voltages, so that the withstand voltages of the switching elements can be lowered. By lowering the withstand voltages of the circuit parts, the apparatus can be downsized.

In order to secure high output power on LV side, a full-wave rectifying type current doubler method is adopted. In this case, in order to change the DC-DC converter into a high-powered circuit, plural switching elements are made to operate simultaneously and parallel, which enables high output power to be secured. In an example shown in FIG. 8, four elements, that is, SA1 to SWA4, or SWB1 to SWB4, are made to operate parallel.

In addition, by disposing two switching circuits and two small reactors (L1 and L2), which are smoothing reactors, parallel with each other so that they are symmetrically positioned, the high output power is obtained. As described above, disposing two small reactors enables the entirety of the DC-DC converter to be more downsized in comparison with the case where one large reactor is disposed.

Figure 9:
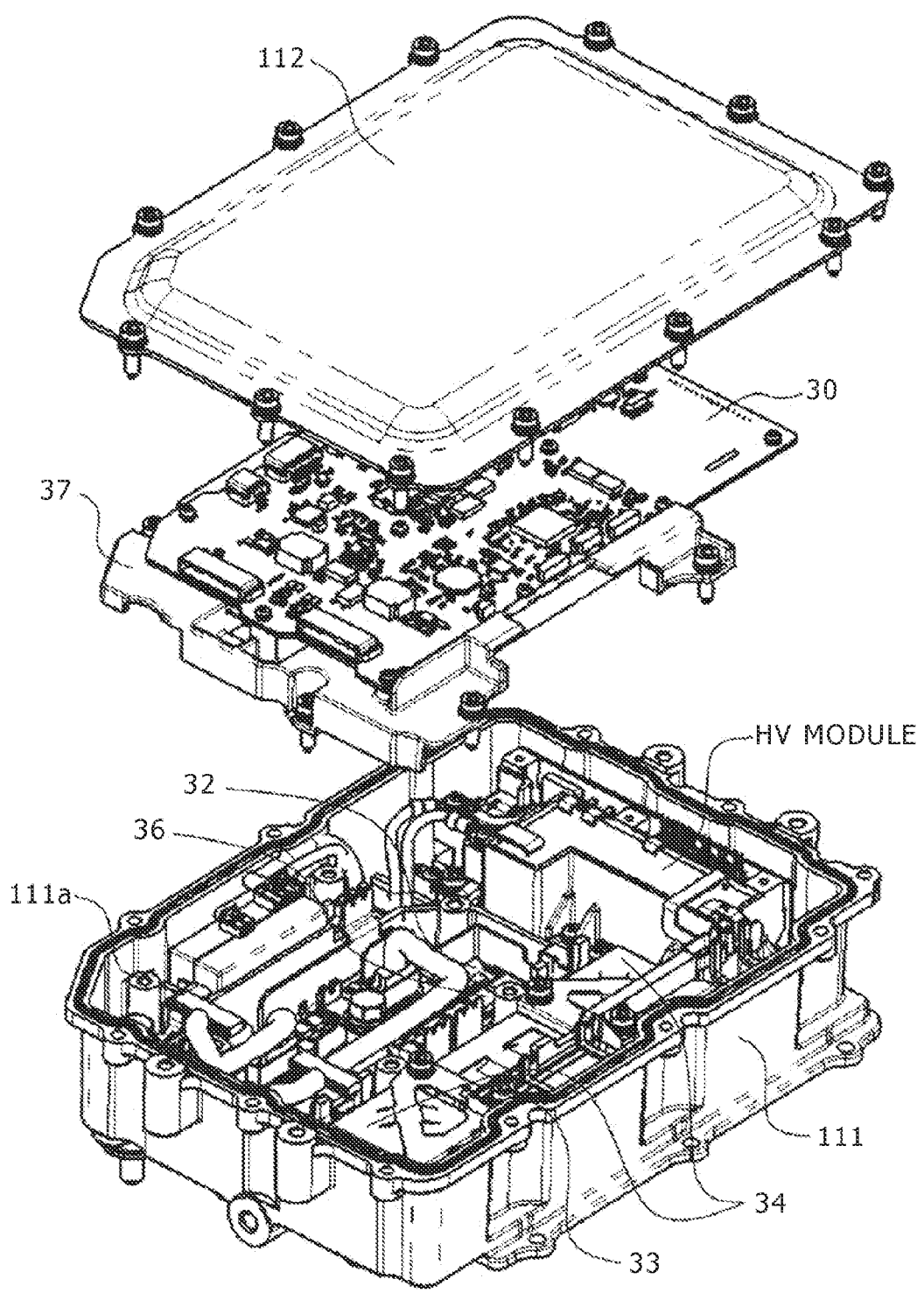
FIG. 9 is an exploded perspective view showing the component arrangement of the DC-DC converter.
Figure 10:
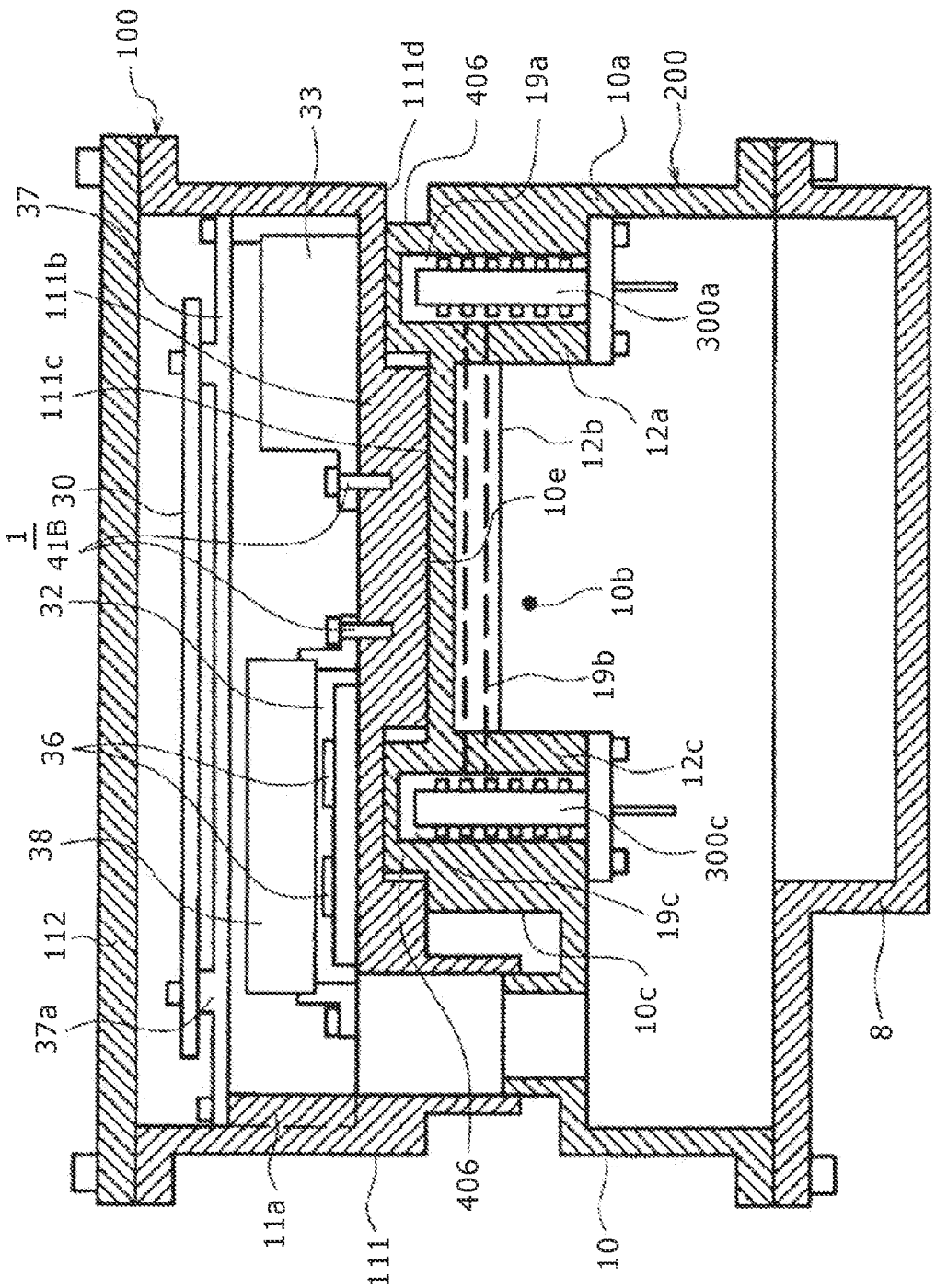
FIG. 10 is the cross-section view of the power conversion apparatus on which the inverter and the DC-DC converter are mounted.
Figure 11:
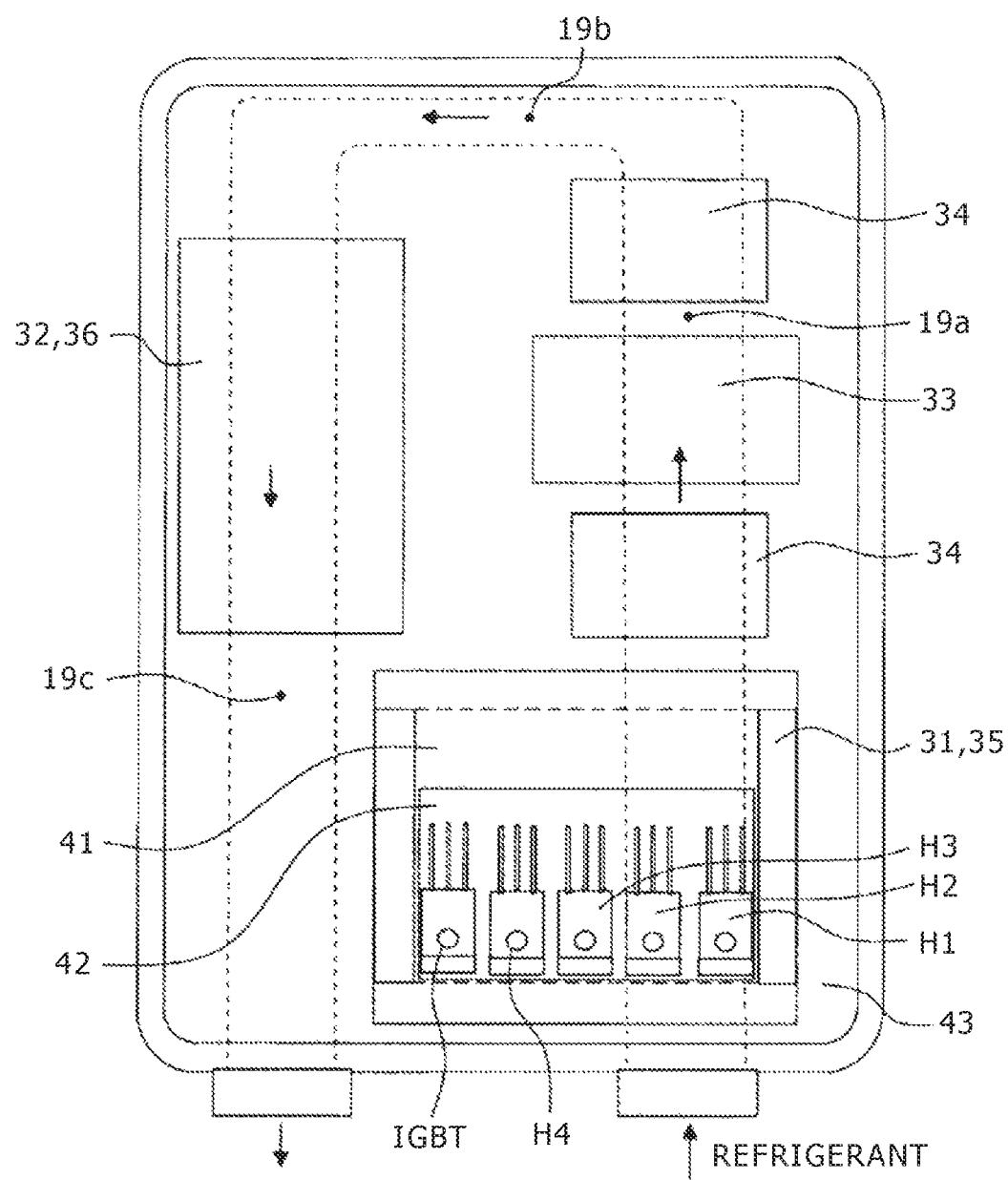
FIG. 11 is a schematic view showing the component arrangement in the case of the DC-DC converter.

FIG. 9, FIG. 10, and FIG. 11 are diagrams explaining the component arrangement of the DC-DC converter 100. FIG. 9 is an exploded perspective view of the DC-DC converter 100. FIG. 10 is the cross-section view of the power conversion apparatus 1 including an integrated combination of the DC-DC converter 100 and the inverter 200. FIG. 11 is a schematic view showing the component arrangement in the case of the DC-DC converter 100.

As shown in FIG. 9, the circuit parts of the DC-DC converter 100 are housed in the case 111 made of metal (for example, made of aluminum die-casting). A case cover 112 is fixed to the opening of the case 111 with bolts. As described above, the case 10 of the inverter 200 is fixed to the bottom surface side of the case 111.

A main transformer 33, inductor elements 34, a power semiconductor module 35 on which switching elements H1 to H4 are mounted, a step-up circuit board 32 on which switching elements 36 are mounted, a capacitor 38, and the like are installed on the bottom of the case 111. Main heat-generating components are the main transformer 33, the inductor elements 34, the power semiconductor module 35, and the switching elements 36.

The relationship between the components of the circuit shown in FIG. 8 and the components shown in FIG. 9 are as follows: the main transformer 33 corresponds to a transformer Tr, the inductor elements 34 respectively correspond to the reactors L1 and L2 of a current doubler, the switching elements 36 respectively correspond to the switching elements SWA1 to SWA4, and SWB1 to SWB4. Switching elements S1, S2, and the like shown in FIG. 8 are also mounted on the step-up circuit board 32.

As shown in FIG. 11, the terminals of the switching elements H1 to H4 extend upward in the case, and are coupled to a step-down circuit board 31 disposed on the upper part of the power semiconductor module 35. The step-down circuit board 31 is fixed onto plural supporting members protruding upward from the bottom surface of the case. In the power semiconductor module 35, the switching elements H1 to H4 are mounted on a metal board on which patterns are formed, and the bottom surface of the metal board is firmly fixed to the bottom surface of the case. The step-up circuit board 32 on which the switching elements 36 are mounted is also formed of a similar metal board.

A control circuit for controlling the switching elements installed in the step-up circuit and the step-down circuit is mounted on a control circuit board 30. The control circuit board 30 is fixed to a metal baseboard 37. The baseboard 37 is fixed to plural supporting parts 111a protruding upward from the bottom of the case 111. Therefore, the control circuit board 30 is disposed over the heat-generating components (the main transformer 33, the inductor elements 34, the power semiconductor module 35, and the like), which are disposed on the bottom surface of the case, via the baseboard 37.

The disposition of the components installed in the DC-DC converter 100 will be described with reference to FIG. 10 and FIG. 11. Here, in the cross-section view shown in FIG. 10, only power semiconductor modules 300a to 300c mounted on the channel forming section 12 are shown as the components housed in the inverter 200. As described above, the channel forming sections 12a to 12c are respectively installed along the side walls 10a, 10b, and 10c in the case 10 of the inverter 200.

The first channel section 19a is formed in the channel forming section 12a along the side wall 10a, the second channel section 19b is formed in the channel forming section 12b along the side wall 10b, and the third channel section 19c is formed in the channel forming section 12c along the side wall 10c. The power semiconductor module 300a is inserted in the first channel section 19a, and the power semiconductor module 300c is inserted in the third channel section 19c. Here, although it is not shown in FIG. 10, the power semiconductor module 300b is inserted in the first channel section 19a.

In the case 111 of the DC-DC converter 100, the concave portion 111d and the convex portion 111c are formed on the outer periphery of a case bottom 111b. As shown in FIG. 10, the concave portion 111d of the case 111 is formed at least in an area facing convex portions 406 formed on the outer periphery of the bottom of the case 10. In other words, the concave portion 111d faces the channel sections 19a, 19b, and 19c via the convex portions 406. In addition, the convex portion 111c is formed so that the convex portion 111c faces an area surrounded by the convex portions 406 on the outer periphery of the bottom of the case 10.

Although it is not shown in FIG. 10, there is installed a sealing member with a good heat conductivity (a cooling sheet, or heat conductive grease) between the case 111 and the case 10. The main transformer 33 is fixed to the inner periphery of the case facing the first channel section 19a. On the other hand, the step-up circuit board 32, on which the switching elements 36 are mounted, and the capacitor 38 are fixed to the inner periphery of the case facing the third channel section 19c. The main transformer 33, the step-up circuit board 32, the capacitor 38, and the like are fixed to the bottom of the case 111 with bolts 41B or the like, and the areas of the bottom of the case whose thicknesses are large (for example, the convex portion 111c) have threaded screw holes. In addition, in the case where components are disposed on the areas of the bottom of the case that do not face the channel sections 19a, 19b, nor 19c, the thicknesses of the areas are set large so that the opposite ends of the areas get into touch with the case 10, with the result that the improvement of cooling efficiency for the components can be expected.

The baseboard 37 is fixed onto the supporting parts 111a formed inside the case 111 with bolts. The control circuit board 30 is fixed onto convex portions 37a formed on the upper surface of the baseboard 37 with bolts or the like. The case cover 112 is fixed to the opening of the case 111, so that the inside of the case is hermetically sealed.

Because parts of the bottom of the case 111 (such as the concave portion 111d, the convex portion 111c) are thermally in touch with the case 10 of the inverter 200, the case 111 is indirectly cooled by the refrigerant flowing through the channel sections 19a to 19c of the case 10. The cooling is effectively performed by fixing the components to the bottom of the case. Particularly, while the refrigerant is directly in touch with the convex portions 406, components that have large heating values are disposed on the areas with which the convex portions 406 of the lower cover 402 are in touch, with the result that the improvement of the cooling efficiency can be expected.

In addition, because the baseboard 37 is made of metal, heat generated by the control circuit board 30 is transferred to the case 10 via the supporting parts 111a and the case 111. Further, the baseboard 37 functions as a shielding member for shielding radiant heat radiated from the heat-generating components installed on the bottom surface of the case, and if the baseboard 37 is made of copper or the like, it has also a function of shielding switching radiant noises radiated from the switching elements.

A plan view of FIG. 11 is a diagram showing the arrangement of the heat-generating components mounted on the bottom surface of the case 111 in the case of the DC-DC converter with the case cover 112 removed. Dashed lines show the disposition of the channel sections 19a to 19c installed in the case 10 of the inverter 200. The channel sections 19a to 19c are installed in a U-shaped state on the bottom surface side of the case 111, and the first channel section 19a and the third channel section 19c are installed parallel with each other. The refrigerant that flows into the first channel section 19a from the entrance pipe 13 flows through the second channel section 19b and the third channel section 19c in this order, and flows out from the exit pipe 14.

The main transformer 33 and two inductor elements 34 are disposed on the bottom of the case that faces the first channel section 19a. In addition, the power semiconductor module 35 and the step-down circuit board 31, which configure the step-down circuit, are disposed mainly on the bottom surface of the case facing the first channel section 19a. The switching elements 36 and the step-up circuit board 32, which comprises the step-up circuit, are disposed mainly on the bottom surface of the case facing the third channel section 19c. As described above, by disposing the components that have comparatively large heating values on the positions facing the channel sections 19a to 19c, it becomes possible to increase the cooling efficiency.

(Background of the Present Invention and Explanation of Practical Example of the Present Invention)

Figure 12:
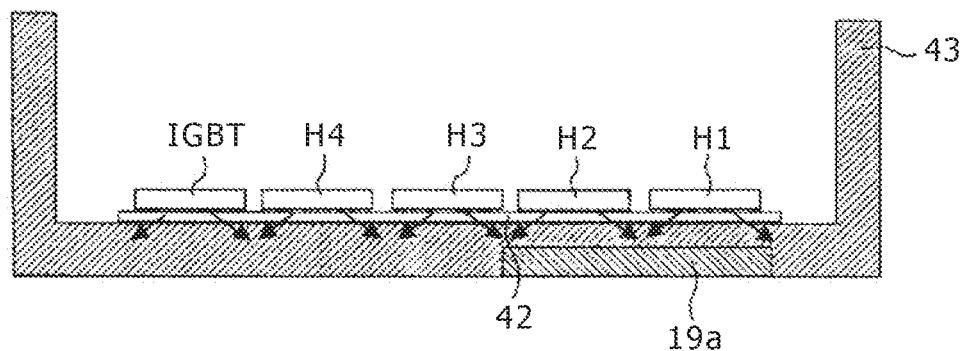
FIG. 12 is a side cross-section view showing the configuration of a step-down circuit and a power semiconductor module according to the related art.
Figure 13:
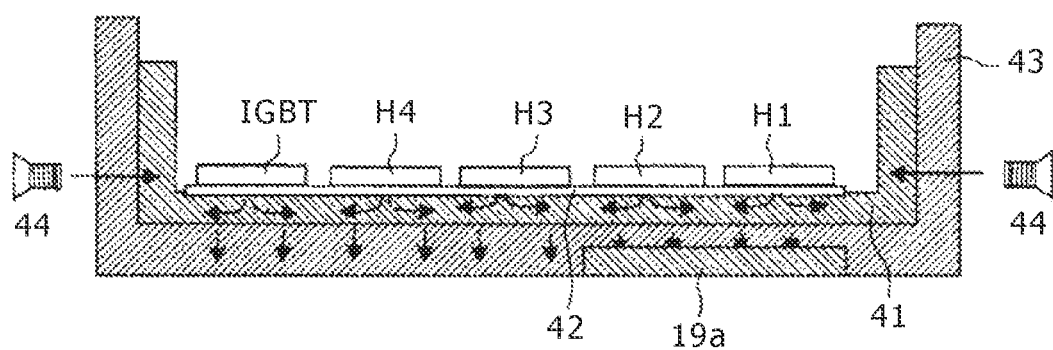
FIG. 13 is a side cross-section view of the step-down circuit and the power semiconductor module used for explaining the present invention.

The target of the present invention is a power conversion apparatus described above as an example, and hereinafter a practical example of the present invention will be described along with a background where the present invention is needed. However, in order to make the present invention easy-to-understand, FIG. 11 to FIG. 13 show the simplified configurations of some parts of the present invention.

As shown in FIG. 11, because the channels 19a, 19b, and 19c, which comprise a cooling passage formed in the inverter 200, are formed so as to surround the capacitor module 500, it is natural that the shapes and dimensions of the channels 19a, 19b, and 19c should be limited. To put it concretely, the shape of the channel is formed in a U-shaped state, and the length of the width direction of the channel cannot be fully secured, with the result that the length of the height direction is extended so that the necessary flow volume of the refrigerant can be secured.

Therefore, as can be seen from FIG. 11, the switching elements H1 to H4, which are installed on a heat conductive insulating sheet 42 in the case 111 of the DC-DC converter 100 fixed onto the inverter 200, are disposed almost perpendicularly to the channel direction of the cooling passage 19a. In this case, another switching element IGBT is also disposed in a similar way as the switching elements H1 to H4. This switching element IGBT has a function of switching the behavior of the DC-DC converter 100 so that the DC-DC converter 100 can perform the two-way DC-DC conversion.

Generally speaking, because the switching elements H1 to H4 of the power semiconductor module 35 in the step-down circuit 31 deal with a large amount of power, heating values generated by these switching elements become large. Therefore, as shown in FIG. 11, the step-down circuit 31 is disposed over the channel 19a so that the switching elements H1 to H4 and the switching element IGBT can be cooled as effectively as possible by the channel 19a.

However, as was mentioned at the beginning, it is required for such an apparatus as this power conversion apparatus 1 to be installed in a small space such as an engine room, therefore it is necessary that the apparatus should be assembled as compactly as possible.

Therefore, if it is attempted to downsize the inverter 200, because the downsizing of the capacitor module is impossible (even if it is possible, the extent of the downsizing is limited), it becomes necessary to shorten the widths of the channels 19a, 19b, and 19c. In this case, if the step-down circuit 31 is disposed over the channel 19a in order to cool the step-down circuit 31, the switching elements H3, H4, and IGBT are disposed outside the cooling range of the channel 19a. Particularly, the switching elements H4 and IGBT that are disposed far from the cooling range of the channel section 19a are apt to be high-temperature more quickly than other switching elements.

The above behavior will be described below with reference to FIG. 12. FIG. 12 is a cross-section view showing the state in which the switching elements H1 to H4 and the switching element IGBT are installed, and these components are schematically and simply depicted.

In FIG. 12, the switching elements H1 to H4 and the switching element IGBT are installed in a switching element-housing chassis 43 corresponding to the case 111 made of aluminum alloy or the like via the heat conductive insulating sheet 42 with good heat conductivity.

To put it concretely, the switching elements H1 to H4 and the switching element IGBT are respectively fixed to the switching element-housing chassis 43 with screws via the heat conductive insulating sheet 42 with good heat conductivity such as heat conductive grease and/or a cooling silicon rubber sheet. In addition, as the material of the switching element housing chassis 43, ADC 12-type aluminum die-casting, which is a typical material of aluminum die-casting, is used.

As described above, the switching element housing chassis 43 can be integrally fabricated in combination with the case 111 of the DC-DC converter 100, or can be coupled to the case 111 with the use of fixing means such as screws after being fabricated separately from the case 111.

In the case where a thermal diffusion state generated by the switching elements H1 to H4 and the switching element IGBT is taken into consideration in such a configuration, because the switching elements H1 to H4 and the switching element IGBT are lying side-by-side, the switching elements generate large thermal interferences among themselves by generating heats, and the flows of the heats are mixed in adjacent spaces, with the result that it becomes difficult for the heats to be effectively diffused, and the heats are liable to accumulate. In this case, because the heats generated by the switching elements H1 and H2, which are disposed within the cooling range of the channel 19a, are removed by the refrigerant flowing through the channel 19a, the temperatures of the switching elements H1 and H2 do not rise so much. On the other hand, the temperatures of the switching elements H3, H4, and IGBT that are disposed outside the cooling range of the channel 19a rise higher than the temperatures of the switching elements H1 and H2 disposed within the cooling range of the channel 19a, which leads to a tendency for the switching elements H3, H4, and IGBT to be easily affected by adverse thermal influences.

To address such a problem, the present invention will propose the following measures. FIG. 13 is a diagram showing a typical practical example of the present invention, and it is assumed that the switching element housing chassis 43 is the same as shown in FIG. 12.

A radiator 41 is housed inside the switching element housing chassis 43. Although this radiator 41 is formed so as to be attached firmly to the switching element housing chassis 43, heat conductive grease is inserted between the radiator 41 and the switching element housing chassis 43 in order to improve heat conduction.

In addition, the side wall of the switching element housing chassis 43 and the side wall of the radiator 41 are firmly joined with screws 44. Of course the heat conductive grease that improves heat transfer is inserted between the side wall and the side wall of the switching element housing chassis 43. Further, it is conceivable that the radiator 41 is integrally fixed by the screws 44 inside the switching element housing chassis 43 in consideration of waterproof property and the like.

The switching elements H1 to H4 and the switching element IGBT are installed parallel over the long side of the radiator 41, and they are respectively fixed to the side of the radiator 41 with screws via the heat conductive insulating sheet 42 with good heat conductivity such as heat conductive grease and/or a cooling silicon rubber sheet.

In this practical example, as the material of the switching element housing chassis 43, ADC12-type aluminum die-casting, which is a typical material of aluminum die-casting, is used, and as the material of the radiator 41, A6063-type aluminum die-casting, which is a typical material of a cooling plate, is used. As the material of the switching element housing chassis 43, ADC12-type aluminum die-casting is used, and the heat conductivity of the ADC12-type aluminum die-casting is about 92 W/(m·K), while as the material of the radiator 41, A6063-type aluminum die-casting is used, and the heat conductivity of the A6053-type aluminum die-casting is about 209 W/(m·K).

With the use of the above measures, although the heats generated by the switching elements are transferred to the radiator 41, because the heat dissipation ability of the radiator 41 is good, and there occur no large mixing phenomena of heat currents among neighboring switching elements, there are only little interferences among the neighboring switching elements.

Therefore, because the thermal diffusion characteristic is improved, the cooling efficiency for the switching elements H3, H4, and the switching element IGBT that are disposed outside the cooling range of the channel 19a can be increased. As a result, the temperatures of the switching elements H1 to H4 and the switching element IGBT do not rise, which makes it possible to suppress adverse thermal influences.

In this case, it is not practical to fabricate the switching element housing chassis 43 with the same material as the material used for fabricating the radiator 41 because the fabrication cost of the switching element housing chassis 43 increases. This is because components except for heat-generating components do not require much cooling capability, so that it is not advantageous to use an expensive material.

Figure 14:
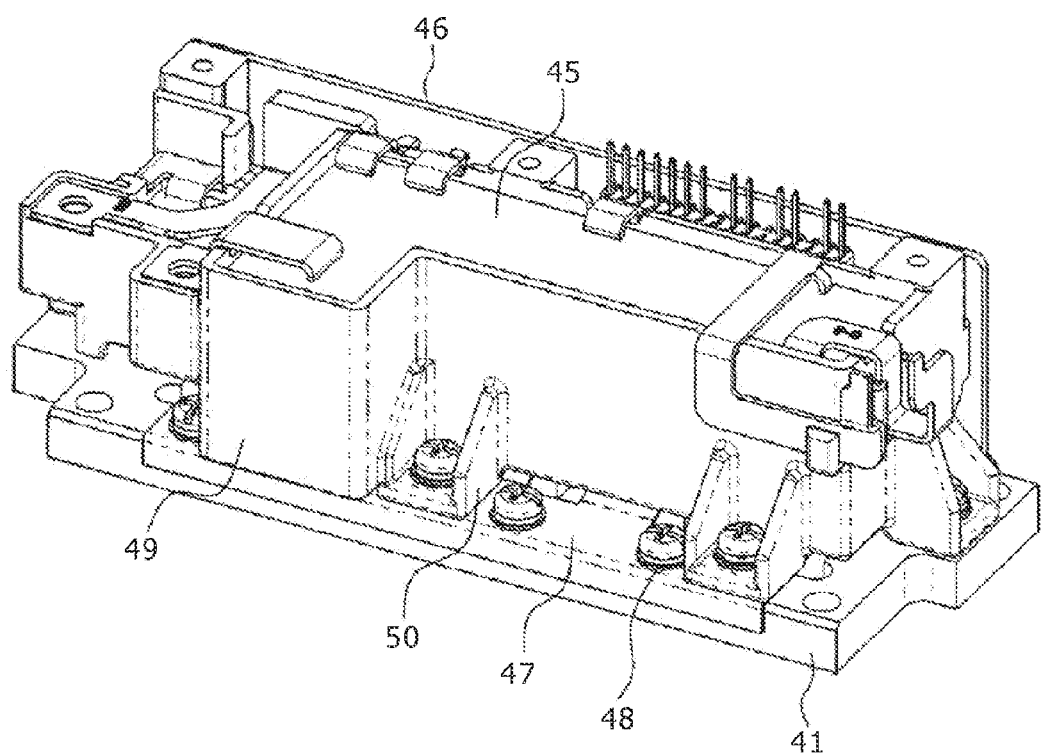
FIG. 14 is the perspective view of the assembly of the DC-DC converter on which a capacitor module, switching elements, and a control board are mounted.

The above is a fundamental concept of the present invention, and a concrete practical example to which the concept of the present invention is applied will be described below. FIG. 14 is a diagram showing an assembly including the portion of step-down circuit as a main component, and FIG. 15 is an exploded perspective view of the assembly.

In FIG. 14, the reference sign 41 designates the radiator shown in FIG. 13, and the switching elements, the capacitor module 45 for the DC-DC converter, the control board 46, and the like are installed on this radiator 41. These components are fixed with screws or the like in an all-in-one assembly, and at the same time, this assembly is fixed in the case 111 of the DC-DC converter 100 with screws.

Figure 15:
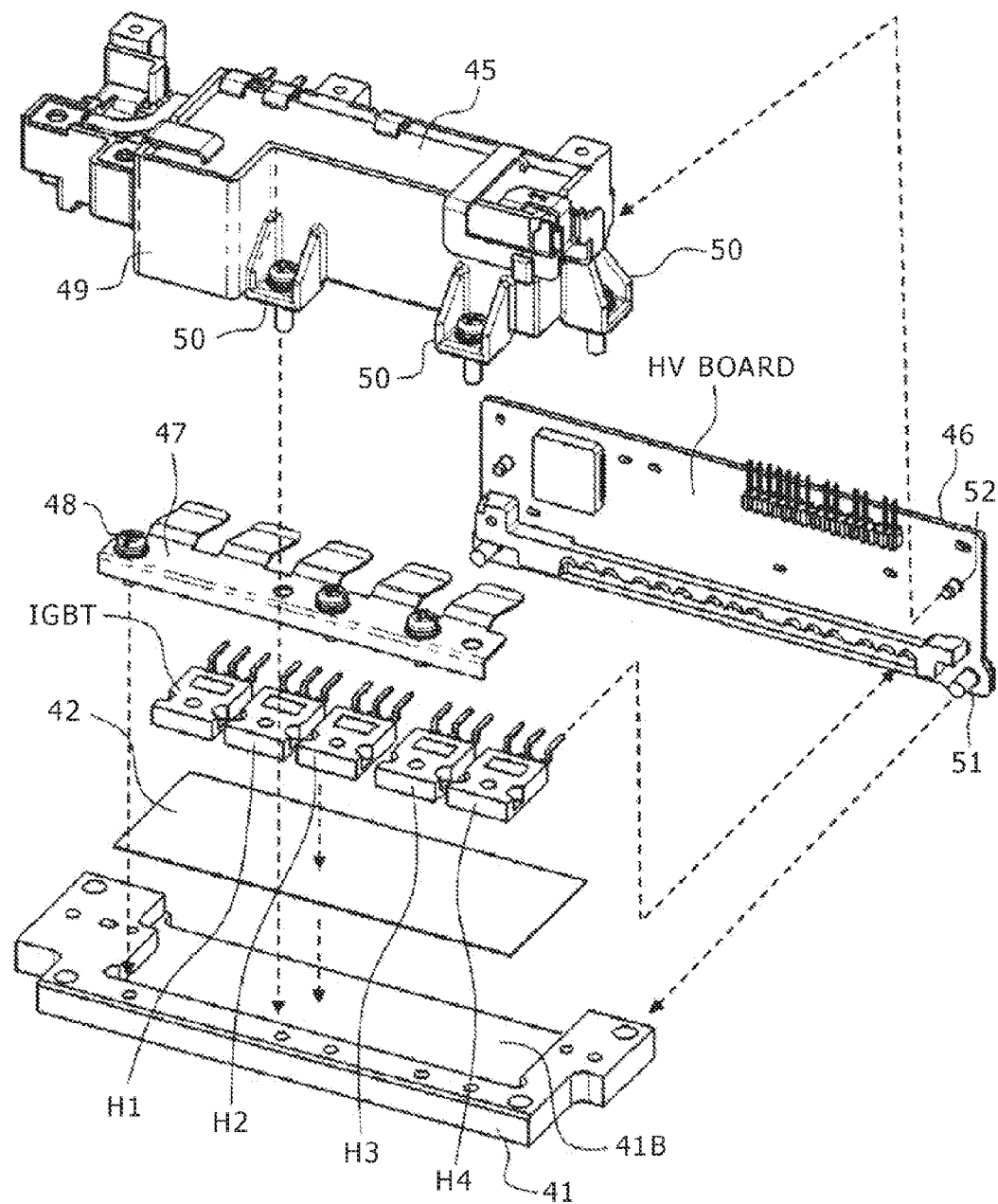
FIG. 15 is an exploded perspective view of the assembly shown in FIG. 14.

To put it in detail, as shown in FIG. 15, a concave housing portion 41B, which houses the switching elements H1 to H4 and the switching element IGBT, is formed nearly in the central part of the radiator 41 whose shape is a rectangular solid having a predefined thickness, and this concave housing portion 41B is covered with the heat conductive insulating sheet 42. In addition, the switching elements H1 to H4 and the switching element IGBT are installed parallel on this heat conductive insulating sheet 42.

The switching elements H1 to H4 and the switching element IGBT are firmly pressed against the heat conductive insulating sheet 42 by a plate spring 47, and some parts of the plate spring 47 are tightly fixed to the radiator 41 with screws 48.

Therefore, the plate spring 47 firmly presses the switching elements H1 to H4 and the switching element IGBT against the heat conductive insulating sheet 42 with the use of the screws 48 as fulcrums.

The capacitor module 45 also includes a capacitor case 49 and mounting brackets 50 integrally formed along with the capacitor case 49, and a capacitor is housed in the capacitor case 49, while spaces between the capacitor and the capacitor case 49 are filled with resin or the like leaving no space between. Next, by fixing the mounting brackets 50 to the radiator 41 with screws, the capacitor module 45 and the radiator 41 are integrated in an all-in-one assembly.

Therefore, the switching elements H1 to H4 and the switching element IGBT are disposed between the capacitor module 45 and the radiator 41.

The control board 46 is disposed at the rear end of the radiator 41 as shown in FIG. 14, and positioning pins 51 are implanted in both lower ends of this control board 46. These positioning pins 51 are inserted into positioning holes (not shown) at the rear end of the radiator 41, and subsequently the control board 46 is fixed to the capacitor case 49 with screws 52.

After the radiator 41, the capacitor module 45, and the control board 46 are assembled, the terminals of the switching elements H1 to H4 and the switching element IGBT are respectively coupled to the control circuit of the control board 46.

In such an assembly as configured above, although the heats generated by the switching elements are transferred to the radiator 41, because the heat dissipation ability of the radiator 41 is good as described above, and there occur no large mixing phenomena of heat currents among neighboring switching elements, there are only little interferences among the neighboring switching elements. Therefore, because the thermal diffusion characteristic is improved, the cooling efficiency for the switching element H3, the switching element H4, and the switching element IGBT that are disposed outside the cooling range of the channel 19*a* can be increased.

As a result, the temperatures of the switching elements H1 to H4 and the switching element IGBT do not rise, which makes it possible to suppress adverse thermal influences. The assembly of such a constitution can be compactly configured as above, and at the same time, this assembly configured as above can be easily joined to the case 111 of the DC-DC converter 100.

As for the problem of the present invention, that is, the cooling of heats generated by the switching elements H1 to H4 and the switching element IGBT, because the heats are dissipated by the radiator 41 with a good heat dissipation ability, there occur no large mixing phenomena of heat currents among neighboring switching elements, and there are only little interferences among the neighboring switching elements. Therefore, because the thermal diffusion characteristic is improved, the cooling efficiency for the switching elements H3 and H4 and the switching element IGBT that are disposed outside the cooling range of the channel 19*a* can be increased.

In this practical example, although, as the material of the radiator 41, A 6063-type aluminum die-casting whose heat conductivity is about 209 W/(m·K) is used, the material of the radiator 41 is not limited to the A 6063-type aluminum die-casting, and can be any die-casting as long as its cooling characteristic is better than that of the case 111.

In addition, although the power conversion apparatus in this practical example has been described as an all-in-one assembly in which both inverter 200 and DC-DC converter 100 are integrated together, the present invention can be also applied to another type of DC-DC converter 100 that is used independently and in which a cooling passage such as used in the inverter 200 is formed. In other words, the cooling water passage can be disposed on the wall surface of the case 111 opposite to the position to which the radiator 41 is fixed.

Although the present invention has been described about a power conversion apparatus mounted on a vehicle such as an EV or a PHEV as an example, the present invention is not limited to the above example in its application and can be applied to a power conversion apparatus mounted on a vehicle for construction machinery.

LIST OF REFERENCE SIGNS

10, 111 . . . Case, 10*a* to 10*d* . . . Side Wall, 10*f*, 111*f* . . . Side Surface, 12 . . . Channel Forming Section, 19 . . . Refrigerant Channel, 19*a* . . . First Channel Section, 19*b* . . . Second Channel Section, 19*c* . . . Third Channel Section, 20, 30 . . . Control Circuit Board, 33 . . . Main Transformer, 35 . . . Power Semiconductor Module, 36 . . . Switching Element, 37 . . . Baseboard, 41 . . . Radiator, 42 . . . Heat Conductive Insulating Sheet, 43 . . . Switching Element Housing Chassis, 44 . . . Screw, 45 . . . Capacitor Module, 46 . . . Control Board, 47 . . . Plate Spring, 49 . . . Capacitor Case, 51 . . . Positioning Pin, 100 . . . DC-DC Converter, 111*a* . . . Supporting Part, 111*b* . . . Case Bottom, 406 . . . Convex portion, 111*d* . . . Concave Portion, 200 . . . Inverter, 420 . . . Lower Cover, H1 to H4, IGBT . . . Switching Element

The invention claimed is:

1. A DC-DC converter comprising:
   a transformer for converting voltages;
   a plurality of switching elements for controlling a current flowing through the transformer;
   a metal radiator;
   a metal case for housing the transformer, the switching elements, and the radiator; and
   a refrigerant channel through which a cooled-down refrigerant flows,
   wherein the refrigerant channel is disposed on the outer surface of the case,
   wherein the radiator is formed so that the heat conductivity of the radiator is higher than that of the case,
   wherein the radiator is disposed on the inner surface of the case directly or via a heat conductive member so that the radiator faces the refrigerant channel with the case between the radiator and the channel,
   wherein the switching elements includes a first switching element and a second switching element, and
   wherein, in the case where the first switching element is projected in a direction normal to a surface on which the switching elements are disposed and that is a surface of the radiator, the first switching element is disposed on the radiator via an insulating member so that the projected part of the first switching element is overlapped with the projected part of the refrigerant channel, and the second switching element is disposed on the radiator via an insulating member so that the projected part of the second switching element is prevented from being overlapped with the projected part of the refrigerant channel.

2. The DC-DC converter according to claim 1,
   wherein the transformer is disposed so that the transformer faces the refrigerant channel with the case between the transformer and the channel.

3. A power conversion apparatus comprising an inverter and a DC-DC converter fixed to the outer surface of the inverter,
   wherein the inverter includes a power module for converting DC power into AC power and a refrigerant channel through which a cooled-down refrigerant flows;
   wherein the DC-DC converter includes a transformer for converting voltages, a plurality of switching elements for controlling a current flowing through the transformer, a metal radiator, and a metal case for housing the transformer, the switching elements, and the radiator;

wherein the power module is cooled by a cooled-down refrigerant flowing through the refrigerant channel;

wherein the radiator is formed so that the heat conductivity of the radiator is higher than that of the case;

wherein the radiator is disposed on the inner surface of the case directly or via a heat conductive member so that the radiator faces the refrigerant channel with the case between the radiator and the channel;

wherein the switching elements includes a first switching element and a second switching element, and wherein, in the case where the first switching element is projected in a direction normal to a surface on which the switching elements are disposed and that is a surface of the radiator, the first switching element is disposed on the radiator via an insulating member so that the projected part of the first switching element is overlapped with the projected part of the refrigerant channel, and the second switching element is disposed on the radiator via an insulating member so that the projected part of the second switching element is prevented from being overlapped with the projected part of the refrigerant channel.

4. The power conversion apparatus according to claim 3, wherein the inverter includes a capacitor module for smoothing the DC power supplied to the power module;

wherein the refrigerant channel includes a first channel and a second channel;

wherein the first channel is formed on a first side portion of the capacitor module;

wherein the second channel is formed on a second side portion of the capacitor module and in such a position as to make the second channel faces the first channel with the capacitor module between the second and first channels; and wherein, in the case where the first switching element is projected in a direction normal to a surface on which the switching elements are disposed that is a surface of the radiator, the first switching element is disposed so that the projected part of the first switching element is overlapped with the projected part of the first channel, and the second switching element is disposed so that the projected part of the second switching element is overlapped with the projected part of the capacitor module.

* * * * *